(12) United States Patent
Kurosawa

(10) Patent No.: US 6,657,703 B2
(45) Date of Patent: Dec. 2, 2003

(54) EXPOSURE APPARATUS, MAINTENANCE METHOD THEREFOR, SEMICONDUCTOR DEVICE MANUFACTURING METHOD, AND SEMICONDUCTOR MANUFACTURING FACTORY

(75) Inventor: Hiroshi Kurosawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/858,964

(22) Filed: May 17, 2001

(65) Prior Publication Data

US 2002/0009175 A1 Jan. 24, 2002

(30) Foreign Application Priority Data

May 19, 2000 (JP) ........................................ 2000-148831

(51) Int. Cl.[7] ............................................... G03B 27/52
(52) U.S. Cl. ........................................................ 355/55
(58) Field of Search .............................. 355/53, 55, 57, 355/77; 382/145

(56) References Cited

U.S. PATENT DOCUMENTS

| | | | |
|---|---|---|---|
| 4,849,901 A | * 7/1989 | Shimizu | 250/491.1 |
| 4,996,640 A | 2/1991 | Yamada et al. | |
| 5,112,133 A | 5/1992 | Kurosawa et al. | 356/401 |
| 5,113,229 A | 5/1992 | Higashio et al. | |
| 5,115,320 A | 5/1992 | Ebihara et al. | |
| 5,182,615 A | 1/1993 | Kurosawa et al. | 356/400 |
| 5,883,701 A | 3/1999 | Hasegawa et al. | 355/53 |
| 5,999,707 A | 12/1999 | Taniguchi et al. | |
| 6,028,659 A | * 2/2000 | Kaneko | 355/53 |
| 6,198,982 B1 | * 3/2001 | Park et al. | 356/237.3 |
| 6,215,896 B1 | * 4/2001 | Greig et al. | 382/149 |
| 6,385,497 B1 | * 5/2002 | Ogushi et al. | 700/109 |

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

An exposure apparatus which has a stage for aligning a substrate surface to an imaging plane on the basis of a detection signal from a focus sensor, moves the substrate by the stage, transfers a projection pattern, and exposes the substrate. The apparatus includes a controller for, when an exposure shot region on the substrate cannot converge to a predetermined precision, determining the exposure shot as an error, and controlling the stage so as to move the substrate to a predetermined position upon determination of the error, and an exposure unit for forcibly transferring the projection pattern onto the substrate at the predetermined position in the exposure shot and exposing the substrate.

54 Claims, 15 Drawing Sheets

FIG. 7
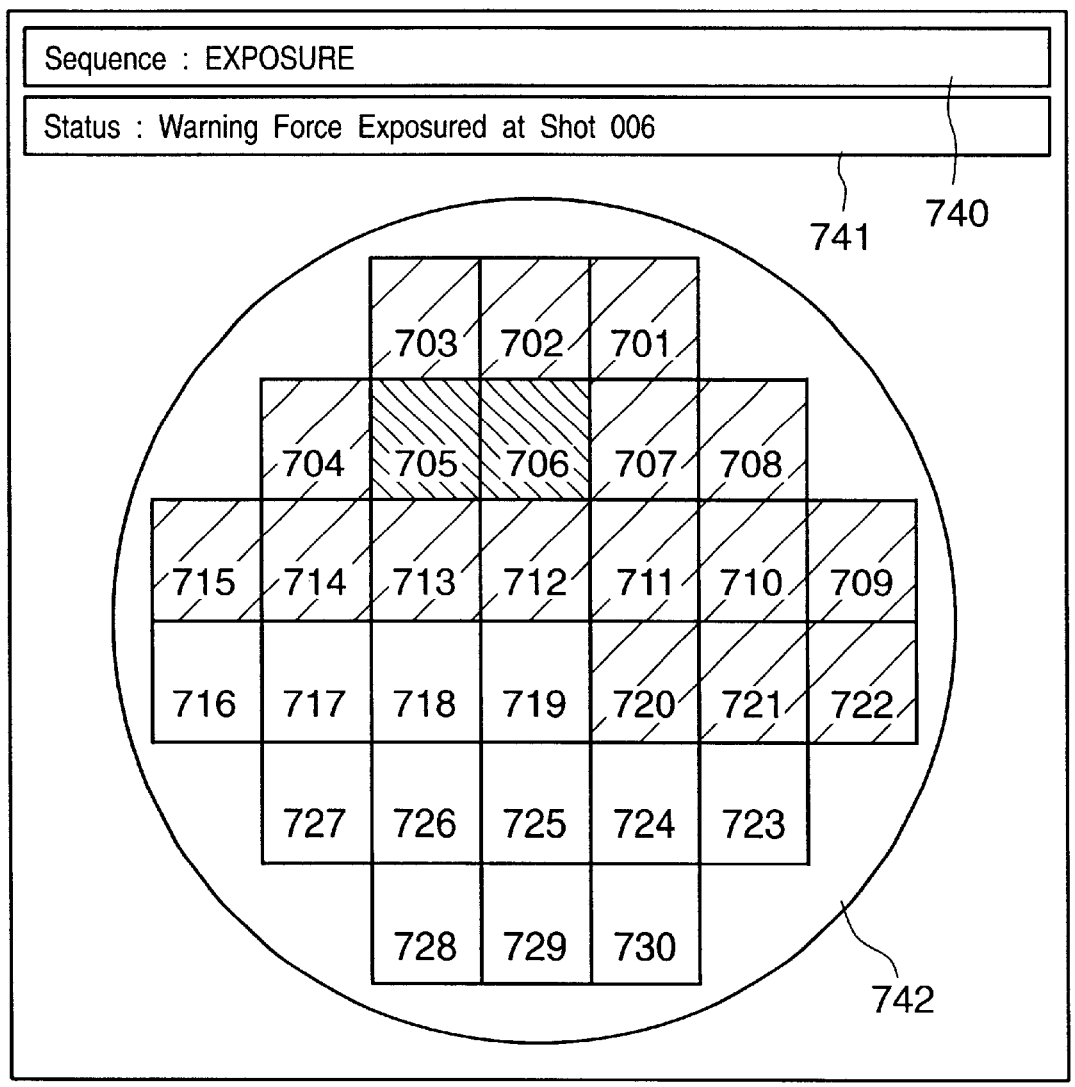
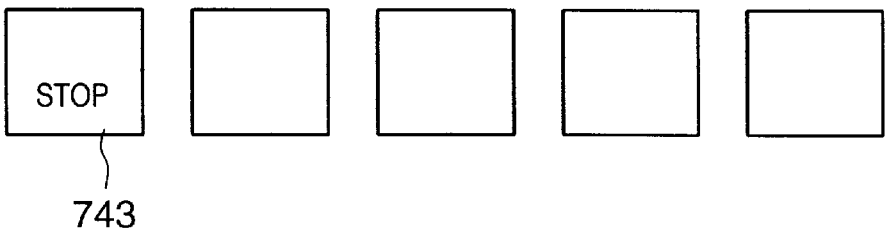

FIG. 10

| | |
|---|---|
| URL | http://www.maintain.co.jp/db/input.html |

TROUBLE DB INPUT WINDOW

OCCURRENCE DATE  2000/3/15  ~1004
TYPE OF APPARATUS  \*\*\*\*\*\*\*\*\*  ~1001
SUBJECT  OPERATION ERROR (START-UP ERROR)  ~1003
SERIAL NUMBER S/N  465NS4580001  ~1002
DEGREE OF URGENCY  D  ~1005

SYMPTOM  LED KEEPS FLICKERING AFTER POWER-ON  ~1006

REMEDY  POWER ON AGAIN (PRESS RED BUTTON IN ACTIVATION)  ~1007

PROGRESS  INTERIM HAS BEEN DONE  ~1008

[SEND] [RESET]

1010 — LINK TO RESULT LIST DATABASE
1011 — SOFTWARE LIBRARY
1012 — OPERATION GUIDE

SEMICONDUCTOR DEVICE MANUFACTURING FLOW

EXPOSURE APPARATUS, MAINTENANCE METHOD THEREFOR, SEMICONDUCTOR DEVICE MANUFACTURING METHOD, AND SEMICONDUCTOR MANUFACTURING FACTORY

FIELD OF THE INVENTION

The present invention relates to an exposure apparatus used for photolithography in the manufacturing process of a semiconductor integrated circuit, liquid crystal display element, or the like, a maintenance method therefor, a semiconductor device manufacturing method, and a semiconductor manufacturing factory.

BACKGROUND OF THE INVENTION

FIG. 13 is a flow chart showing the focus algorithm of a stationary exposure apparatus (stepper). A focus on a wafer as a substrate loaded onto a wafer stage is measured at a focus measurement shot out of several representative shots on the wafer (step 1301). A global approximate plane as a linear plane which represents the wafer surface is calculated by, e.g., least-square approximation from the obtained focus measurement data (step 1302). The target value of the wafer stage in the Z direction when the wafer stage is driven to locate the wafer surface on the global approximate plane is called a global focus target value, and its target values in the ωx and ωy directions at this time are called global tilt target values.

Shots subjected to global focus/tilt measurement simultaneously undergo alignment measurement at, e.g., alignment mark positions (1401x, 1401y, 1402x, 1402y, 1403x, 1403y, 1404x, and 1404y) of shots hatched on the wafer in FIG. 14. FIG. 14 is a view showing a shot position on the wafer subjected to global focus measurement. To increase the precision of the measured global tilt amount and that of the rotation angle in the θ direction in global alignment, measurement spans in the X and Y directions are preferably widened, and the shots are desirably near the periphery of the wafer.

In FIG. 13, an X-Y stage moves stepwise to a target exposure shot position (step 1303). At the same time, a Z tilt wafer stage moves to a focus/tilt position in the exposure shot that is estimated from the global approximate plane (step 1304). Upon the completion of movement, a focus is measured again at the exposure position (step 1305). Focusing driving (step 1307) and focus measurement (step 1305) are repeated until the focus tolerance check passes (step 1306). In focus measurement (step 1305), a focus sensor measures focus measurement points in a plurality of exposure shots as shown in FIG. 15, and a linear approximate plane obtained from the measurement values is set as a wafer surface. Wafer stage target values for performing focusing so as to locate the wafer surface on an image plane are sequentially calculated. FIG. 15 is a view showing the layout of focus measurement points within an exposure shot in the stationary exposure apparatus.

In FIG. 15, ch1 to ch5 are focus measurement points, one measurement point is formed from five marks (1501a to 1501e), and the average of the measurement values of the respective marks in the focus direction is used as focus measurement data for each point (ch1 to ch5). An exposure shot 1502 is measured at a plurality of focus measurement points (ch1 to ch5). For example, when the focus measurement value of ch5 greatly deviates from those of ch1 to ch4, the wafer surface is regarded to have a defect and is not exposed (case A). Alternatively, as for a greatly different measurement point, its measurement value is not used as focus measurement data, and an approximate plane is calculated from the remaining focus measurement points (case B).

If the focus tolerance passes, the flow waits for convergence of residual vibrations in the X and Y directions generated in the step of focus driving/Abbe correction driving (step 1307) in FIG. 13 (step 1308), and exposure starts (step 1309). In step 1310, whether all the shots have undergone the exposure sequence is checked. If N in step 1310, the focus algorithm (steps 1303 to 1310) is repeated by using the first measured global approximate plane data (step 1302).

The surface of a process wafer may be corrugated by about 5 to 10 [μm] during the manufacturing process. When such a wafer is to be exposed, the exposure sequence is interrupted at the shot of a corrugated portion, and the shot does not allow exposure in a prior art like case A. In this case, in the prior art, the exposure sequence shifts to process the next shot without exposing the shot of a projecting portion. At the unexposed shot, the residual resist amount is larger than that at peripheral shots in the resist developing process, and may adversely affect a resist image at the peripheral shots.

If a focus error is generated by a wafer, the job aborts in the prior art, and the exposure sequence enters a manual operation mode where the operator determines processing of the defective shot.

If a focusing error is generated under the influence of dust or the like attached to a wafer chuck, the chuck must be cleaned to remove its contamination. In a prior art like case B, however, no focusing error is detected, and the contamination of the wafer chuck must be estimated from the wafer developing result.

SUMMARY OF THE INVENTION

The present invention has been made to overcome the conventional drawbacks, and has as its object to provide an exposure apparatus which minimizes the influence of a defective shot on peripheral shots, reduces defective shots, reduces misoperations caused by the operator, and detects contamination of a wafer chuck within the exposure process. The present invention also provides a maintenance method therefor, a semiconductor device manufacturing method, and a semiconductor manufacturing factory.

To overcome the above drawbacks, according to the first aspect of the present invention, there is provided an exposure apparatus which has a stage for aligning a substrate surface to an imaging plane on the basis of a detection signal from a focus sensor, moves the substrate by the stage, transfers a projection pattern, and exposes the substrate, comprising a controller for, when an exposure shot region on the substrate cannot converge to a predetermined precision, determining the exposure shot as an error, and controlling the stage so as to move the substrate to a predetermined position upon determination of the error, and an exposure unit for forcibly transferring the projection pattern onto the substrate at the predetermined position in the exposure shot and exposing the substrate.

According to the second aspect of the present invention, there is provided an exposure apparatus for transferring a projection pattern onto a substrate and exposing the substrate while scanning the substrate by a stage, comprising a controller for, when an exposure shot region on the substrate cannot converge during scan to a predetermined focus precision or leveling precision, a predetermined two-dimensional sync control precision, or a predetermined exposure amount control precision, determining the exposure shot as an error, and controlling the stage so as to move the substrate to a predetermined position upon determination of the error, and an exposure unit for forcibly transferring the projection pattern onto the substrate at the predetermined position in the exposure shot and exposing the substrate.

According to the third aspect of the present invention, there is provided an exposure apparatus for transferring a projection pattern onto a substrate and exposing the substrate while scanning the substrate, comprising a controller for, when an exposure shot region cannot converge to a predetermined focus precision during scan, determining the exposure shot as an error, and controlling a shot beam from an exposure light source upon determination of the error.

According to the present invention, there is provided a semiconductor device manufacturing method comprising the steps of installing manufacturing apparatuses, for performing various processes, including any one of the above-described exposure apparatuses, in a semiconductor manufacturing factory, and manufacturing a semiconductor device by using the manufacturing apparatuses in a plurality of processes.

According to the present invention, there is provided a semiconductor manufacturing factory comprising manufacturing apparatuses, for performing various processes, including any one of the above-described exposure apparatuses, a local area network for connecting the manufacturing apparatuses, and a gateway which allows the local area network to access an external network outside the factory, wherein information about at least one of the manufacturing apparatuses can be communicated.

According to the present invention, there is provided a maintenance method for any one of the above-described exposure apparatuses that is installed in a semiconductor manufacturing factory, comprising the steps of causing a vendor or user of the exposure apparatus to provide a maintenance database connected to an external network of the semiconductor manufacturing factory, authorizing access from the semiconductor manufacturing factory to the maintenance database via the external network, and transmitting maintenance information accumulated in the maintenance database to the semiconductor manufacturing factory via the external network.

According to the fourth aspect of the present invention, any one of the above-described exposure apparatuses further comprises a display, a network interface, and a computer for executing network software, and maintenance information of the exposure apparatus can be communicated via the computer network.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 7 is a view showing an example of the user interface window of the exposure apparatus according to the embodiment of the present invention;

FIG. 10 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will be described in detail below with reference to the accompanying drawings.

[Exposure Apparatus]

Figure 1:
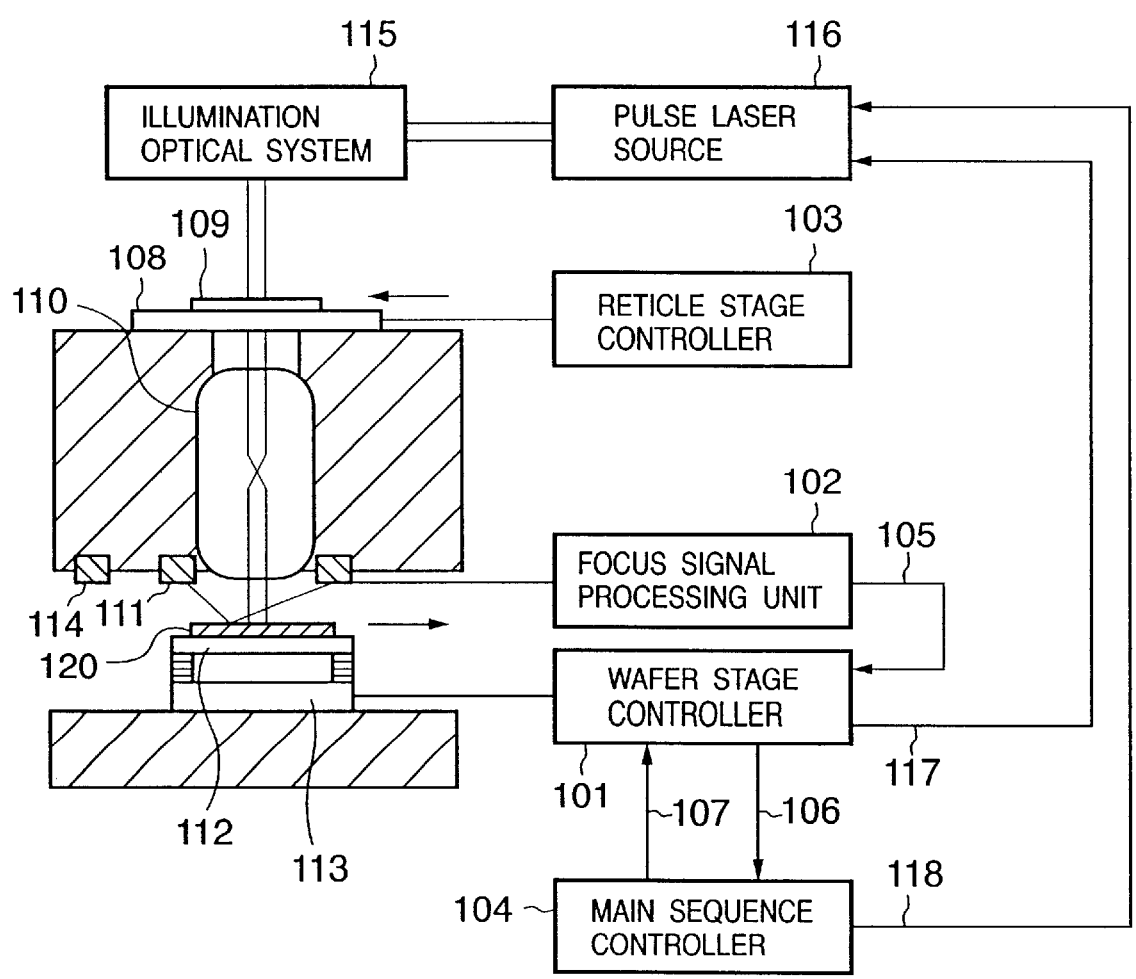
FIG. 1 is a block diagram showing the hardware arrangement of an exposure apparatus according to an embodiment of the present invention.

FIG. 1 shows the hardware arrangement of an exposure apparatus according to an embodiment of the present invention. A reticle 109 set on a reticle stage 108 is scanned at a constant speed in the direction indicated by an arrow in FIG. 1 under the control of a reticle stage controller 103. Part of a pattern image on the reticle 109 serving as a master is horizontally reversed by a projection optical system 110 and projected onto an imaging plane on a focus stage 112. The focus stage 112 is mounted on an alignment stage 113 and performs alignment in the Z direction and tilt directions ($\omega x$ and $\omega y$). The alignment stage 113 is drivable in the X, Y, and $\theta$ directions and is scanned at a constant speed by a wafer stage controller 101 in the direction indicated by an arrow in FIG. 1, i.e., a direction opposite to the driving direction of the reticle stage 108 during scan exposure. The ratio of the scan speeds of the alignment stage 113 and reticle stage 108 is determined from the projection magnification of the projection optical system 110 and the scaling ratio of a transferred image.

A focus measurement sensor 111 as a focus detection mechanism is fixed to an apparatus housing which contains the projection optical system 110, and measures the focus direction of a wafer 120 serving as a substrate set on the focus stage 112. A signal obtained by the focus measurement sensor 111 is converted into a focus measurement value 105 of an expression corresponding to the coordinate system of the wafer stage by a focus signal processing unit 102, and the focus measurement value 105 is transferred to the wafer stage controller 101. In shot exposure, the wafer stage controller 101 controls the manipulation quantity of the focus stage 112 so as to allow the surface of the wafer 120 to reach a focus target value corresponding to an imaging plane included in the argument of an exposure command 107 transferred from a main sequence controller 104 in advance.

Reference numeral 115 denotes an illumination optical system which disperses the coherence of an exposure laser beam from a pulse laser source 116 and shapes the light quantity distribution of a slit shape. The wafer stage controller 101 controls in real time the emission start and stop timings of a pulse laser by using an emission enable signal 117 in accordance with the stage position during scan.

The main sequence controller 104 designates to the alignment stage 113 by using the exposure command 107 a scan driving target value included in a command issued for each shot, and designates to the focus stage 112 a focus target value to an imaging plane and an initial focus target value (to be referred to as a neighboring focus target value hereinafter) for performing preset before scan exposure. The main sequence controller 104 sends a pulse energy/wavelength command signal 118 to the pulse laser source 116 for each shot or every predetermined timing. After one shot is exposed, a focus control target value 106 of the focus stage 112 calculated by the wafer stage controller 101 is sent back to the main sequence controller 104 in order to achieve alignment in the focus direction of the shot. This data is used as the neighboring focus target value of a subsequent shot. The neighboring focus target value is used as the target value of the focus/tilt axis of the wafer stage in executing forced exposure (to be described with reference to a flow chart) when the wafer 120 is so corrugated as to generate a focusing error at the next exposure shot. When the focusing error shot is the first exposure shot on the wafer 120, a global tilt target value (to be described later) is used as the target value of the focus/tilt axis of the wafer stage in executing forced exposure.

Figure 2:
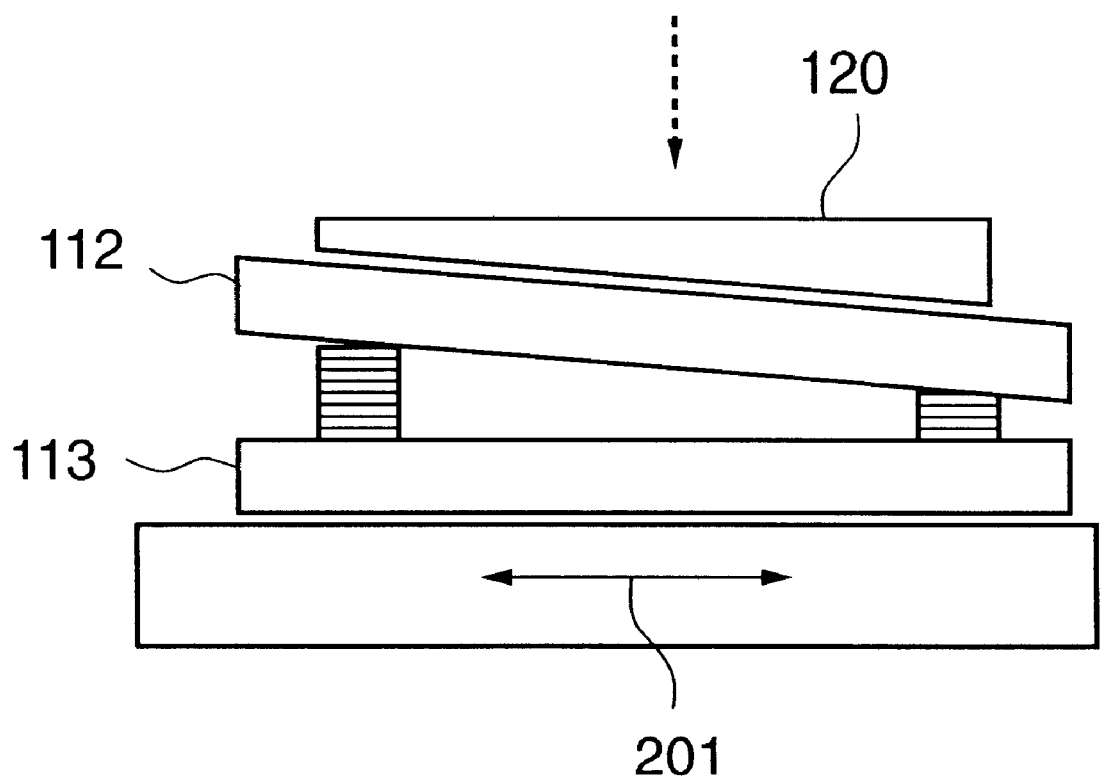
FIG. 2 is a view showing a state when a wafer surface is driven to a global tilt plane.

FIG. 2 is a view showing a state after the wafer stage is driven to a position where the global approximate plane is measured as (Z, ωx, ωy)=(0,0,0) when the next global focus/tilt measurement is similarly done by using a value obtained by global focus/tilt measurement. In FIG. 2, the same reference numerals as in FIG. 1 denote the same parts.

The surface of the wafer 120 is parallel to a driving locus (wafer stage traveling surface 201) with a constant target value in the Z direction of the wafer stage. As far as the surface of the wafer 120 is ideally parallel, no defocus occurs below an exposure slit in scan exposure in this stage. In practice, however, local corrugations exist on the surface of the wafer 120 to a considerable amount with respect to the depth of focus. Thus, focus is measured during exposure, and a laser must be focused not to defocus the surface of the wafer 120 immediately below the slit. This amount is 3 to 4 [$\mu$m] at a maximum with respect to the global tilt plane on a general single-side-polished wafer 120, though the amount changes depending on the surface polishing step or process of the wafer 120. To the contrary, the focus control precision assigned to focus control in exposure is about 0.1 [$\mu$m] according to the 0.15 $\mu$m L/S rule.

Figure 3:
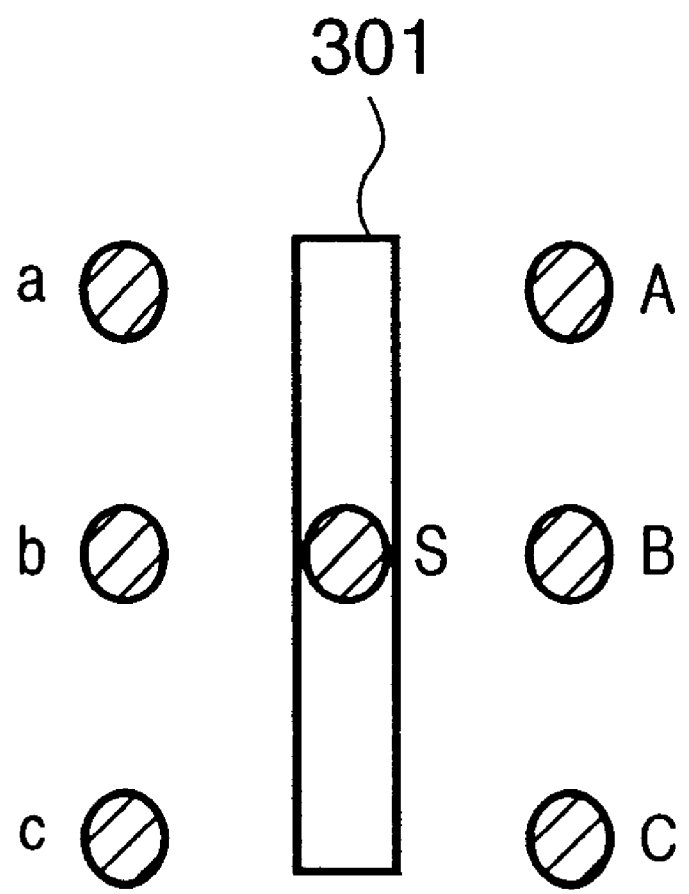
FIG. 3 is a view showing the positional relationship between an exposure slit and focus measurement points on the imaging plane in the exposure apparatus according to the embodiment of the present invention.

FIG. 3 shows the positional relationship between an exposure slit and focus measurement points on the imaging plane in the exposure apparatus according to the embodiment of the present invention. When the alignment stage 113 (FIG. 2) scans the wafer in the direction indicated by arrow 1, focus measurement points a, b and c are used, and when the alignment stage 113 scans the wafer in the direction indicated by arrow 2, focus measurement points A, B, and C are used. A focus measurement point S is also set at the center of the shot. Focus is measured at combined points (a, b, c, S) and (A, B, C, S) during one cycle of a plurality of focus measurements even during a scan in order to confirm a convergence result in the focus direction during exposure. In the focus measurement cycle, an obtained focus measurement value is determined as a focus convergence error under the following conditions (when convergence within a given focus alignment precision fails).

(i) Variations in measurement values from the average of measurement values at a, b, and c exceed a prescribed allowable amount.

(ii) An absolute tilt amount calculated from $\omega y=(a-c)/L$ exceeds a prescribed allowable amount.

(iii) An absolute focus amount calculated from $Z=(a+b+c)/3$ exceeds a prescribed allowable amount.

(iv) The differences between Z and ωy obtained by previous focus measurement, and Z and ωy obtained by current focus measurement exceed prescribed allowable amounts, respectively.

The focus convergence error occurs in the following two cases (A) and (B).

(A) A convergence error (non-exposure focus error) before exposure starts because an exposure shot is measured for a focus measurement point but the exposure slit does not enter the exposure area.

(B) A convergence error (exposure abort focus error) when the exposure slit enters the exposure area and exposure already starts.

In case (A), the emission enable signal 117 in FIG. 1 is immediately disabled to stop emission of the pulse laser source 116 (shield an exposure beam). In a slow light source system such as a mercury lamp light source, a high-speed shutter may be arranged in the illumination optical system 115 to shield an exposure beam.

In case (B), exposure can be immediately stopped, like case (A), which produces an exposed portion and an unexposed portion within a shot. When exposure intermittently aborts within a shot, a portion where exposure has aborted is stored in the wafer stage controller 101 in FIG. 1, and emission of the illumination optical system 115 starts in a retry mode at the portion where exposure was aborted. In this embodiment, exposure does not abort in such a case for the sake of descriptive simplicity, and exposure continues to the final portion left in the shot region by forcibly exposing the shot. At this time, exposure must continue without any focus measurement value. The values Z and ωy (focus and tilt position) at the final focus measurement position measured normally are most desirably used. A global focus measurement value or the neighboring focus value of a previous shot may be used.

Figure 13:
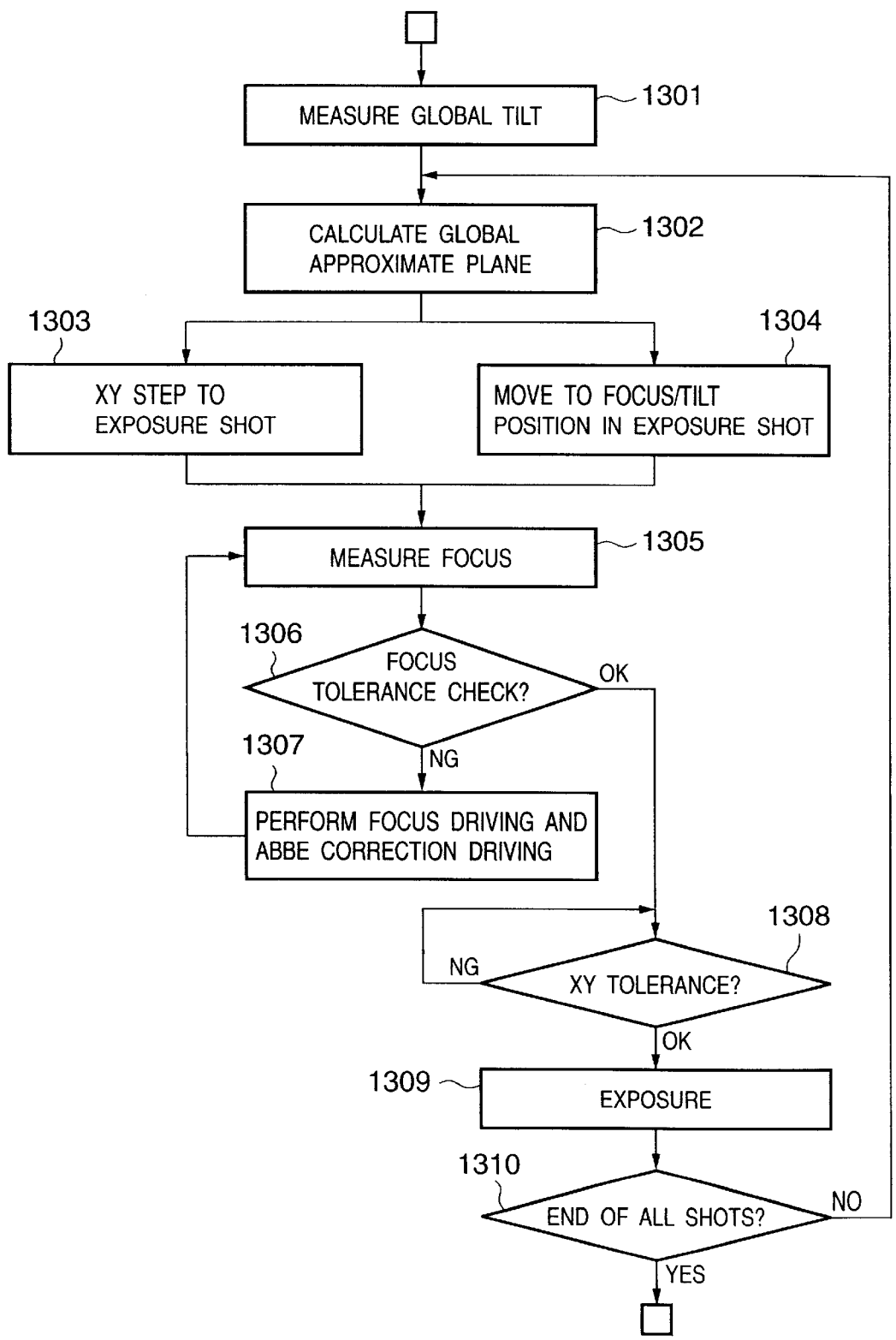
FIG. 13 is a flow chart showing the focus (exposure) algorithm of a conventional stationary exposure apparatus.
Figure 14:
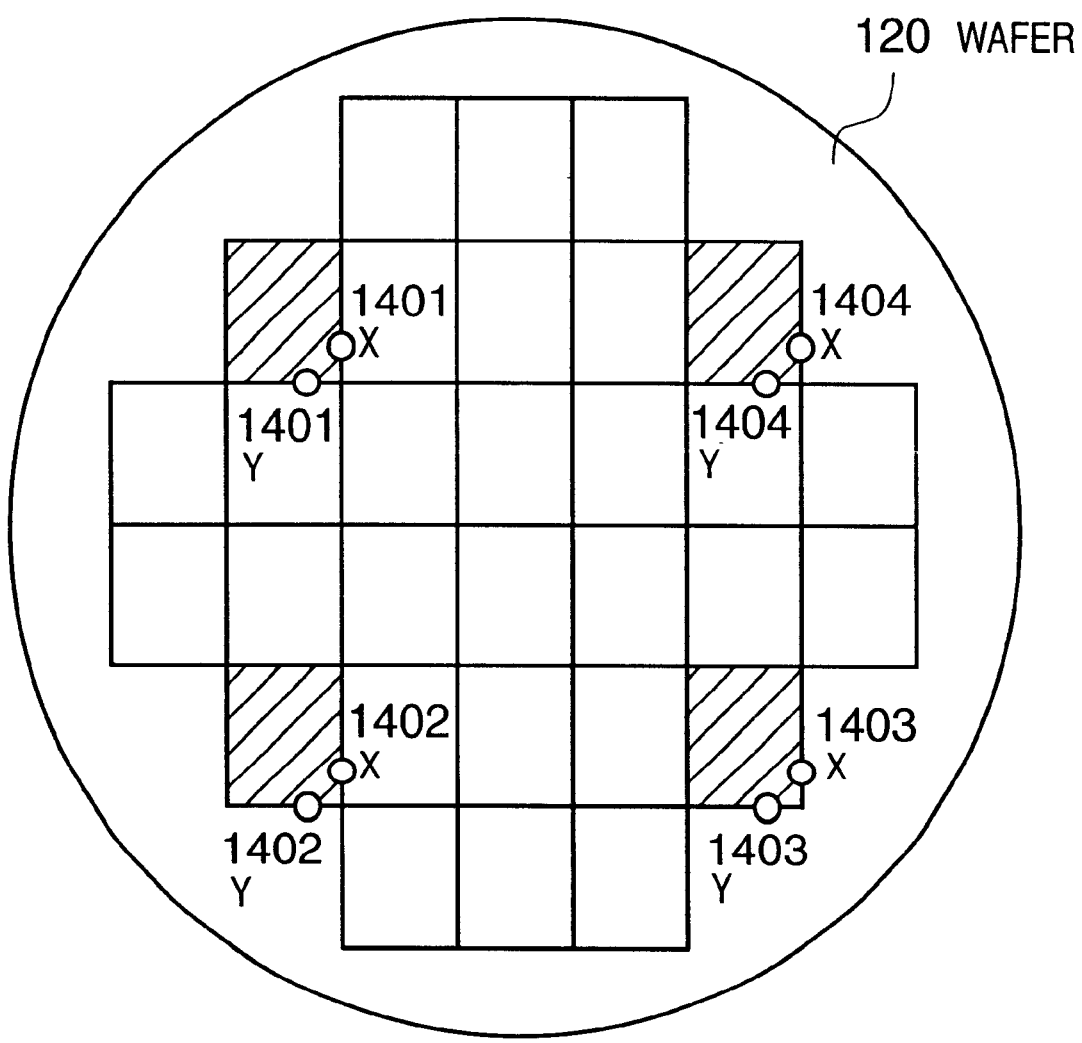
FIG. 14 is a view showing a shot position on a wafer subjected to global focus measurement in the conventional stationary exposure apparatus.
Figure 15:
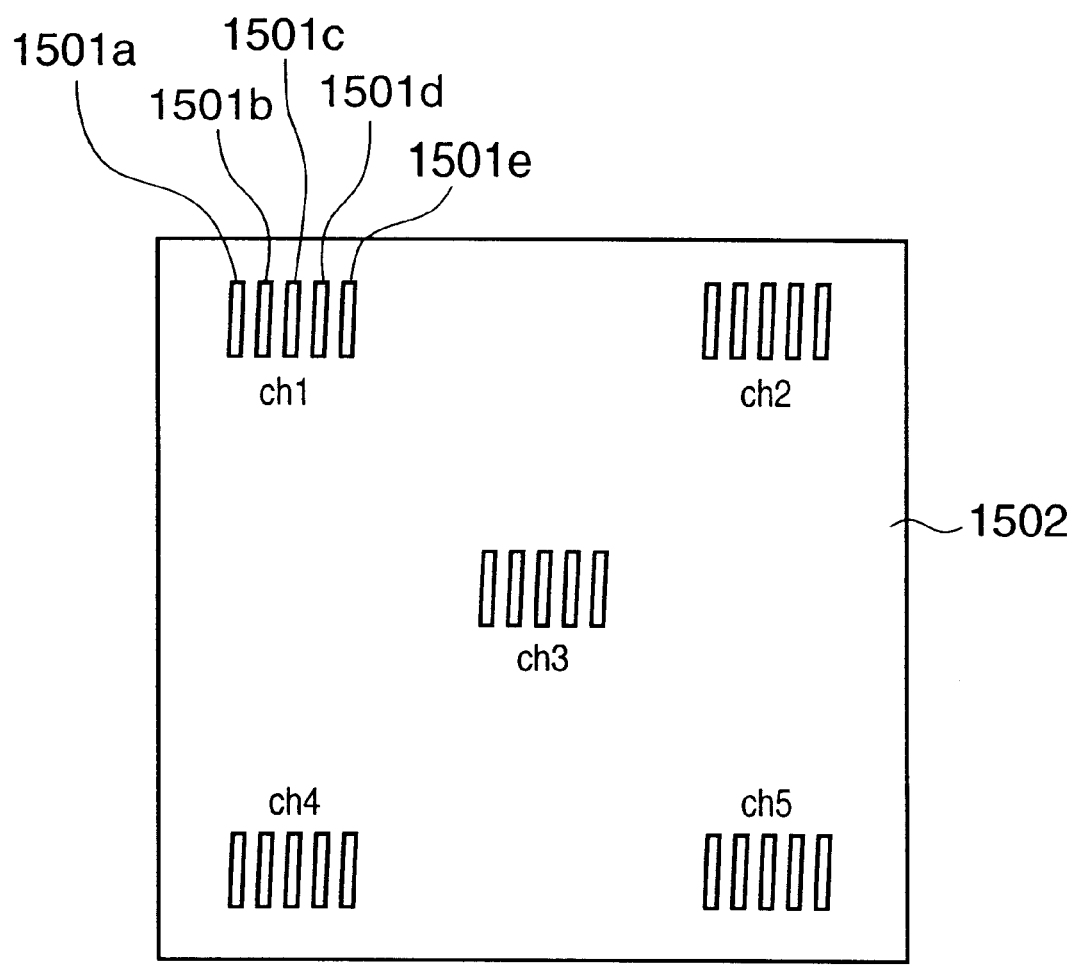
FIG. 15 is a view showing the layout of focus measurement points within an exposure shot in the conventional stationary exposure apparatus.

Also, in a stationary exposure apparatus, a focus control error occurs when, for example, the focus tolerance check does not pass (step 1306) even if the convergence loop for performing focus measurement (step 1305), focus tolerance check (step 1306), and focus driving/Abbe correction driving (step 1307) is repeated a predetermined number of times in the flow chart of the prior art in FIG. 13, or when the variance of measurement values at respective measurement points from a linear approximation plane calculated between focus measurement points in a shot shown in FIG. 15 exceeds a prescribed amount.

Figure 4:
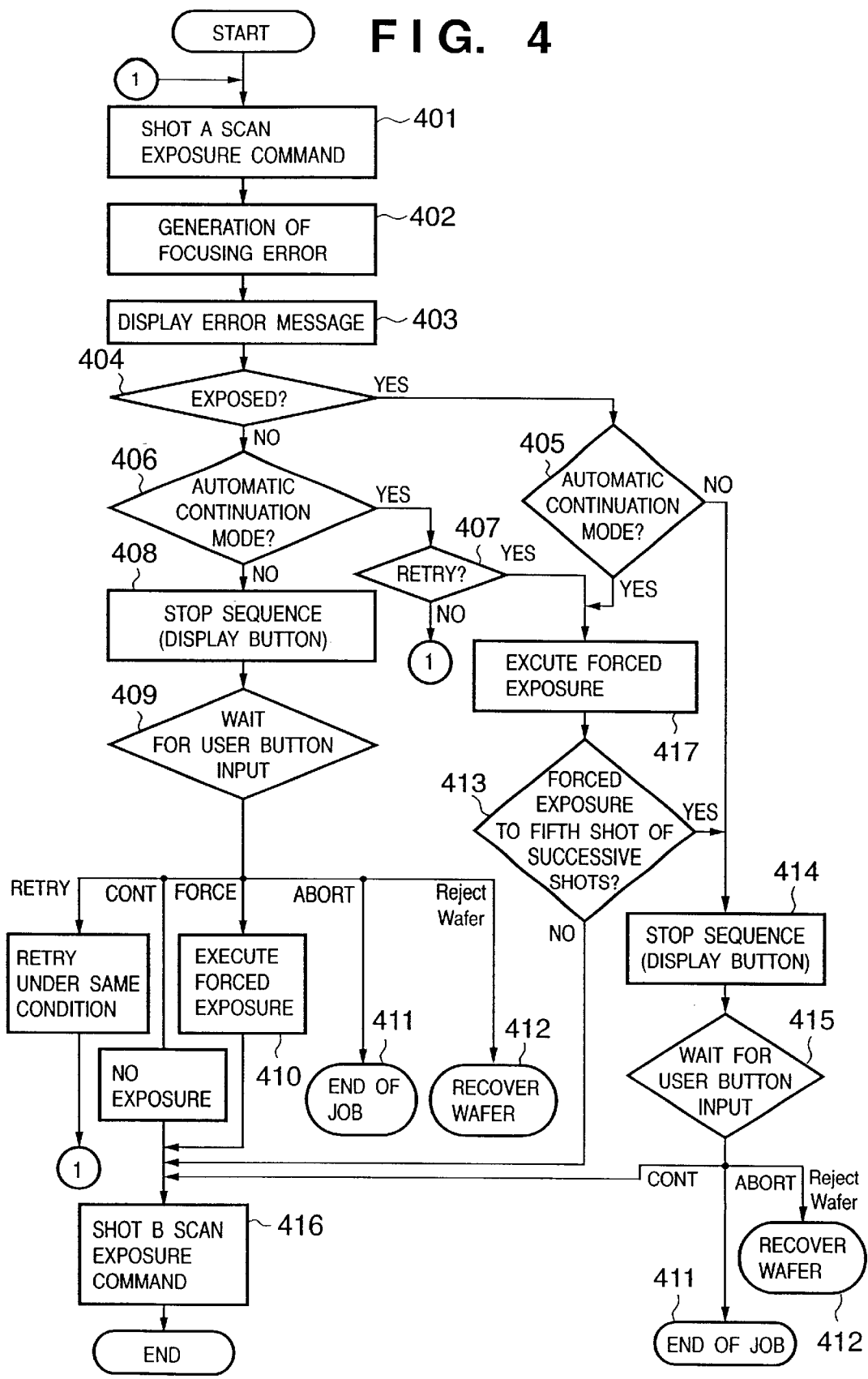
FIG. 4 is a flow chart showing an example of an exposure sequence in the exposure apparatus according to the embodiment of the present invention.

FIG. 4 shows an example of an exposure sequence in the exposure apparatus according to the embodiment of the present invention. A command to a light source upon generation of a focus control (convergence) error is determined, and emission of the exposure light source is controlled in real time by the wafer stage controller 101 (FIG. 1). The wafer stage controller 101 transmits for each shot to the main sequence controller 104 (FIG. 1) a focus control error status and information representing whether a shot has been exposed.

The flow chart in FIG. 4 shows the sequence of the main sequence controller 104 performed based on information from the wafer stage controller 101 that is obtained for each exposure shot. Alignment of the wafer 120 on the wafer stage is measured by an alignment scope 114 before the exposure sequence. After a driving target value for each exposure shot is determined, the main sequence controller 104 enters this sequence.

Figure 5:
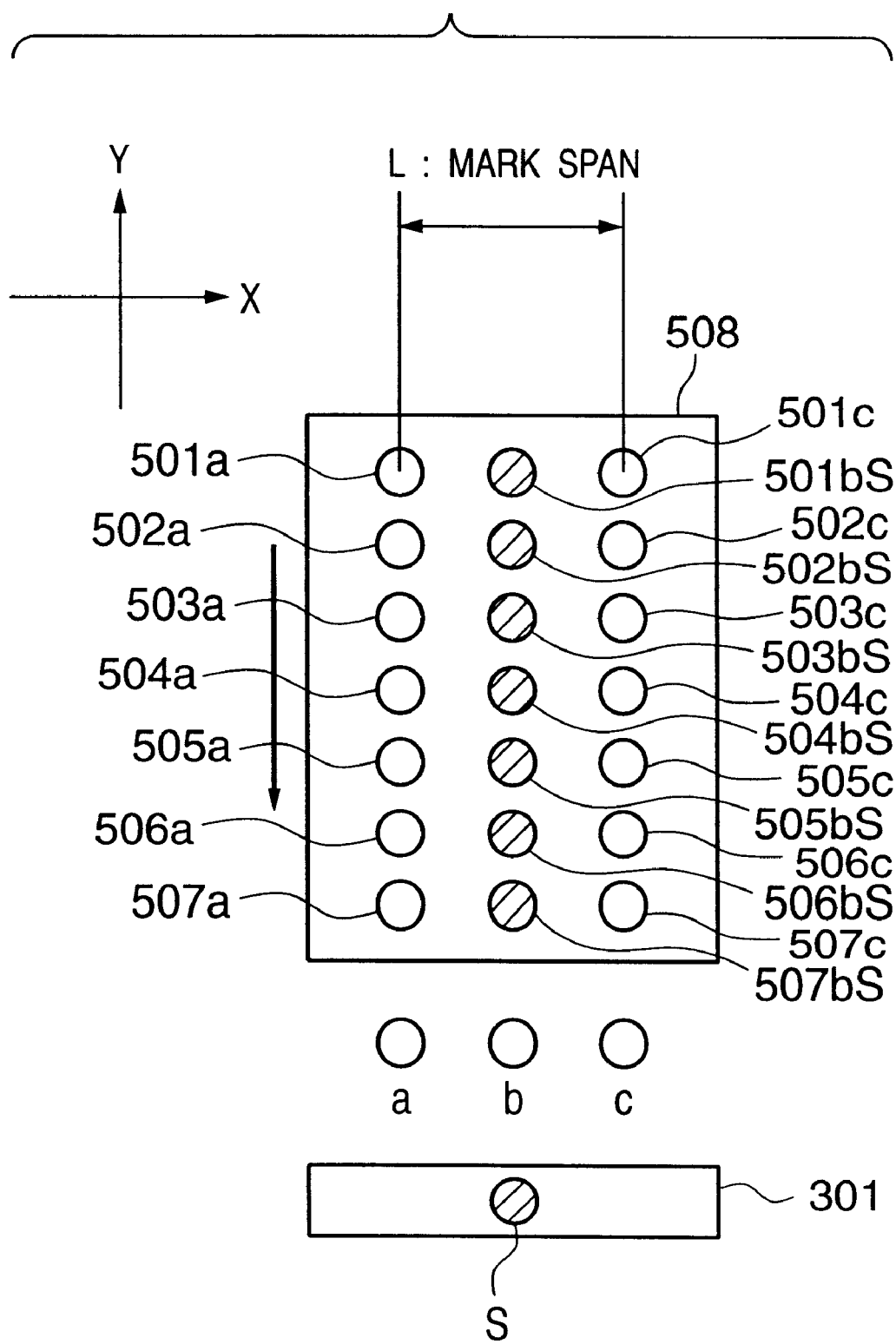
FIG. 5 is a view showing the layout of focus measurement positions and an exposure slit within an exposure shot.

In FIG. 4, if an exposure command 401 for each shot is received, the wafer stage and reticle stage temporarily skip to a pre-scan start point, and scan starts. During scan, a focus measurement unit sequentially measures a focus from 507 to 501 in FIG. 5, and calculates the target value of the wafer stage from the measurement results. FIG. 5 is a view showing the layout of focus measurement positions and an exposure slit 301 (FIG. 3) within an exposure shot 508.

Processing when a focus control error occurs will be explained with reference to FIG. 4.

In FIG. 4, the focus measurement points a, b, and c (FIG. 5) are set before the exposure slit 301 (FIG. 5) in the scan direction, so that a focus control error (focus convergence error) 402 may occur before or during exposure. At this time, the exposure apparatus immediately displays, e.g., a message window on a user interface to display an error message (403).

For a focus convergence error, whether the target shot has already been exposed is determined (404), and if the target shot has already been exposed, the flow shifts to a sequence 405 of determining whether the current mode is an automatic continuation mode. If the focus control error 402 occurs, whether the exposure slit 301 (FIG. 5) enters the exposure area and exposure starts is checked. If exposure does not start, processing of inhibiting emission of the pulse light source is immediately executed; if exposure starts, the target shot is completely exposed without stopping emission of the light source. If the target shot is not exposed or a focus control error is generated by a factor such as a disturbance from a floor, retry of the same exposure may succeed.

In a sequence 406, whether an automatic operation mode is set is determined. If Yes in sequence 406, the shot (focus convergence error shot) is exposed under the same conditions. In step 407, whether a focus control error occurs even upon retry in the same shot is checked. If retry fails once, a forced exposure sequence 417 is executed. In forced exposure 417, not a value obtained by measuring the wafer surface, but a global focus/tilt target value which is a target value independent of a focus measurement sensor value, or the focus/tilt target value of the wafer stage obtained during the exposure time of the final portion of the previously exposed shot is adopted as a fixed target Value during scan. In automatic forced exposure 417, even if the reliability of the focus measurement value degrades owing to, e.g., a fault of the focus measurement system, the exposure sequence continues with an improper focus/tilt target value. Forced exposure 417 should, therefore, be limited within a finite number of successive shots. In a sequence 413, if the result of counting the number of successive operations of forced exposure 417 exceeds five shots, the job stops even in the automatic continuation mode (sequence stop 414).

Figure 6:
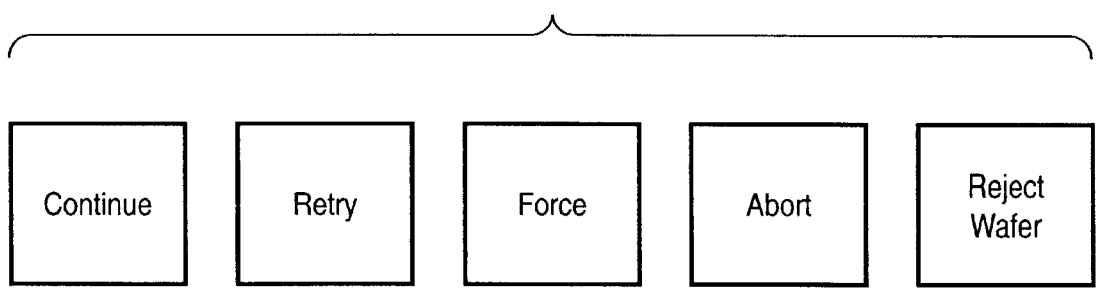
FIG. 6 is a view showing an example of operation buttons displayed upon generation of a focus control error in the exposure apparatus according to the embodiment of the present invention.

If the job stops, buttons as shown in FIG. 6 are displayed on the user interface in order to cause the operator to select (determine) subsequenct processing, and the flow waits for operator designation (sequence 415). FIG. 6 is a view showing an example of operation buttons displayed upon generation of a focus control error in the embodiment of the present invention. In FIGS. 4 and 6, a CONT (Continue) button is for designating continuation of processing. If the operator clicks the CONT button, exposure of a shot suffering a focus convergence error is skipped, and the flow advances to the exposure sequence of the next shot (shot B scan exposure command 416). An ABORT (Abort) button means the end of the exposure job (411), and is for aborting the job in progress and recovering all wafers in process. An RW (Reject Wafer) button is for aborting the exposure sequence of only the current exposure target wafer and recovering the wafer (412). If No in sequence 406, the job immediately aborts (sequence stop 408), and the flow waits for a user button input shown in FIG. 6 (409). Choices in this case are a sequence 415, a RETRY (Retry) button for performing retry processing for a shot suffering a focus control error, and a FORCE (Force) button for performing forced exposure processing 410 when focusing fails.

When a focus control error is generated by the wafer stage controller 101 (FIG. 1) and part of the target shot has already been exposed, the shot has already been exposed in a defocused state. If Y in the sequence 405 (automatic continuation mode), a check in the sequence 413 is performed, and the flow shifts to processing 416 of the next shot; if N, the exposure sequence aborts (sequence stop 414), and the flow waits for a user button input (415).

The position of the shot suffering the focus control error is stored in the main sequence controller 104 (FIG. 1). The generation factors of focus control errors are classified into (A) defects of the wafer surface state, (B) contamination of the wafer chuck surface by a resist peeled from a wafer, (C) vibrations by a disturbance from a floor, and (D) apparatus faults. Among them all, factor (B) can be separated from the cause because focus control errors occur at the same shot position commonly to respective wafers. This embodiment has a function of storing a shot position where focus control errors occur on respective wafers, regarding the focus control errors generated at the same shot position as errors generated by contamination of the wafer chuck, and aborting the job. When contamination of the wafer chuck is detected by this function, the wafer chuck can be exchanged or cleaned to rapidly determine the factor of a focus control error and increase the shot yield.

As for a function of comparing the number of forcedly exposed shots in the automatic continuation modes 405, 406, and 413 with a predetermined number of shots (five shots), selection of execution/non-execution of the automatic continuation mode and designation of a predetermined number of shots can be achieved via a man-machine interface connected to the main sequence controller 104 (FIG. 1). By applying the present invention, it can also be easily realized to record the total number of shots subjected to forced exposure processing for each wafer or lot and transmit the total number to an on-line host machine. When, for example, contamination of the wafer chuck is identified, the operator can be warned of this via the man-machine interface.

Further, the present invention can be applied as error processing when the sync control precision in the alignment direction or the total exposure amount in the exposure slit that is calculated from a monitored illuminance exceeds a preset allowable amount. Whether sync control or exposure amount control achieves a desired precision can be determined only after scan exposure starts. If emission of the exposure light source stops because the desired precision cannot be achieved, a partially unexposed portion is formed and adversely affects peripheral shots which have normally been exposed in developing the resist. Hence, the target shot is preferably completely exposed by forced exposure without stopping exposure when the sync control precision or exposure amount control precision deviates from a standard precision during exposure (to be referred to as a standard precision short error hereinafter). The next shot is normally processed with a high possibility for a standard precision short error generated by floor vibrations, a local factor of the wafer 120 (FIG. 1), or misfire of the pulse laser source 116 (FIG. 1) (omission of emission pulses). In many cases, a standard precision short error generated by the service life of the pulse laser source 116 or a fault of the exposure apparatus occurs at successive shots. Thus, the algorithm of the automatic continuation mode can be similarly applied to monitoring of the exposure amount control precision and sync control precision. The job can continue without stopping the apparatus for an inevitable standard precision short error caused by a local factor, resulting in high apparatus availability. A standard precision short error generated by an apparatus fault or the like can be determined to stop the sequence with a minimum damage by monitoring whether the error is generated at successive shots. As another method of stopping the sequence owing to repeated standard precision short errors, the errors are identified based on the total number of generated errors or the number of generated errors (generation rate) within a predetermined number of exposure shots, other than monitoring of errors at successive shots.

As for the sync precision specification, exposure precision specification, and focus/leveling precision specification of the apparatus, the guaranteed performance is generally defined by sigma. The present invention is effective as a means for determining whether the standard performance of the apparatus is actually achieved and monitoring the standard performance during the operation of the apparatus. This is because an exposure shot which does not probabilistically meet the standard precision necessarily exists, and if an error is determined by giving attention to the exposure result of a single shot, the sequence may stop even during normal operation in terms of the standard definition (sigma).

A stationary exposure apparatus adopts a sequence in which exposure starts after the focus convergence is achieved in advance. When a focus convergence error occurs in the focus convergence process, exposure can be stopped before it starts by canceling emission of a light source or keeping the shutter closed. The stationary exposure apparatus does not require processing 404 of determining whether part of a shot has been exposed upon generation of a focus convergence error in FIG. 4, and processing 405 of determining whether the exposure apparatus operates in the automatic continuation mode. The remaining processes can be similarly applied as the focus control error processing step in the stationary exposure apparatus.

FIG. 7 is a view showing an example of the user interface window of the exposure apparatus according to the embodiment of the present invention. Reference numeral 740 denotes a window for displaying a sequence in progress; 741, a window for displaying an error and warning generated during execution of a job; and 742, a wafer shape to be exposed, on which exposure shots 701 to 730 are hatched upon the completion of exposure. Of the exposure shots 701 to 730, the exposure shots 705 and 706 represent shots suffering focus control errors and are hatched in a different color to allow the operator to discriminate them from normally exposed shots. Reference numeral 743 denotes an operation button. A permitted operation changes depending on a sequence which executes a job, and a menu displayed on the button 743 changes depending on the operation. If a re-exposure enable focus convergence error occurs in a mode other than the automatic continuation mode, operation buttons as shown in FIG. 6 are displayed to wait for operator designation.

[Embodiment of Semiconductor Production System]

A production system for a semiconductor device (e.g., a semiconductor chip such as an IC or LSI, liquid crystal panel, CCD, thin-film magnetic head, micromachine, or the like) using the exposure apparatus will be exemplified. A trouble remedy or periodic maintenance of a manufacturing apparatus installed in a semiconductor manufacturing factory, or maintenance service such as software distribution is performed by using, e.g., a computer network outside the manufacturing factory.

Figure 8:
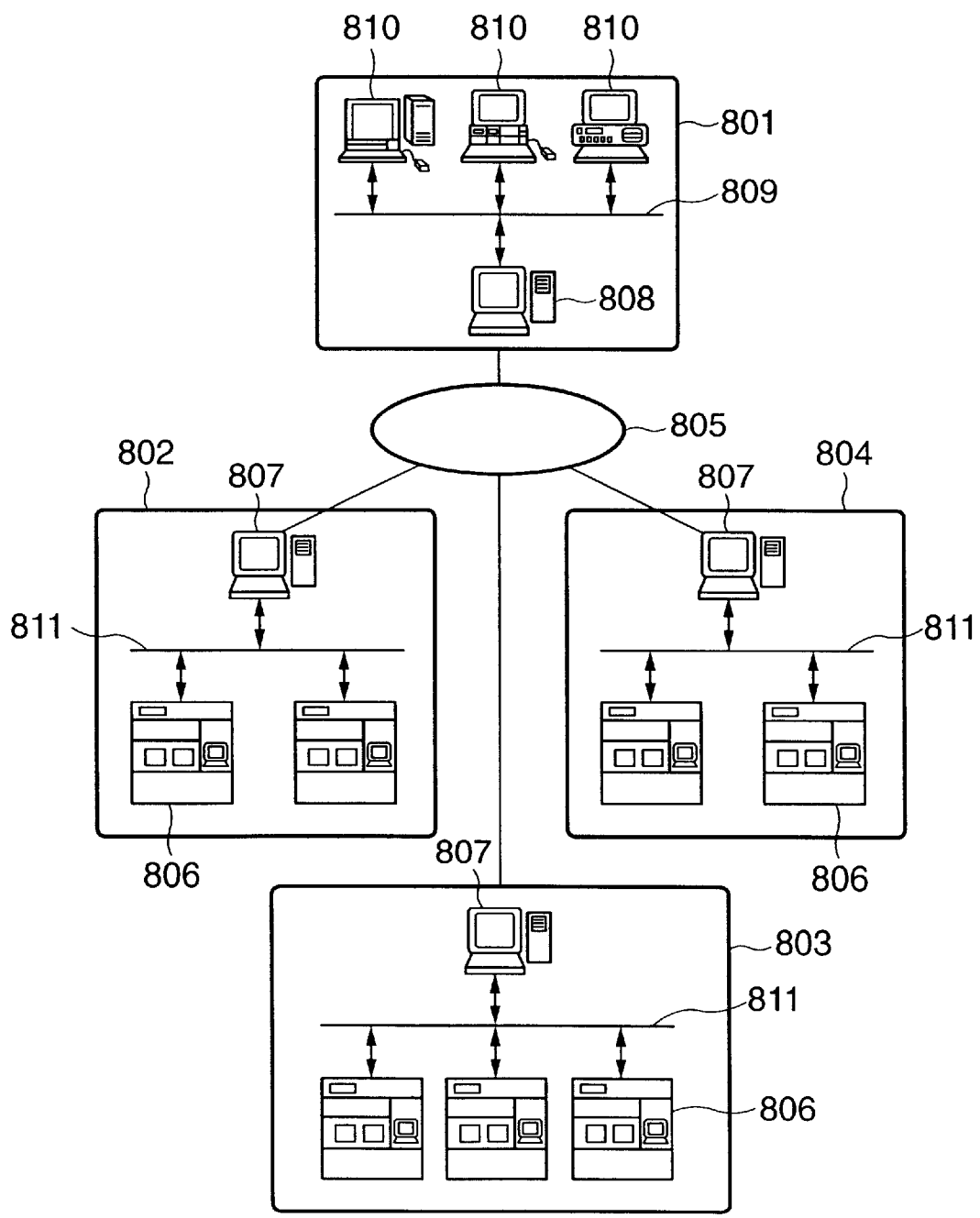
FIG. 8 is a view showing the concept of a semiconductor device production system including the exposure apparatus according to the embodiment of the present invention when viewed from a given angle.

FIG. 8 shows the overall system cut out at a given angle. In FIG. 8, reference numeral 801 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 801 comprises a host management system 808 for providing a maintenance database for the manufacturing apparatus, a plurality of operation terminal computers 810, and a LAN (Local Area Network) 809 which connects the host management system 808 and computers 810 to build an intranet. The host management system 808 has a gateway for connecting the LAN 809 to Internet 805 as an external network of the business office, and a security function for limiting external accesses.

Reference numerals 802 to 804 denote manufacturing factories of the semiconductor manufacturer as users of manufacturing apparatuses. The manufacturing factories 802 to 804 may belong to different manufacturers or the same manufacturer (pre-process factory, post-process factory, and the like). Each of the factories 802 to 804 is equipped with a plurality of manufacturing apparatuses 806, a LAN (Local Area Network) 811 which connects these apparatuses 806 to construct an intranet, and a host management 807 serving as a monitoring apparatus for monitoring the operation status of each manufacturing apparatus 806. The host management system 807 in each of the factories 802 to 804 has a gateway for connecting the LAN 811 in the factory to the Internet 805 as an external network of the factory. Each factory can access the host management system 808 of the vendor 801 from the LAN 811 via the Internet 805. The security function of the host management system 808 authorizes access of only a limited user. More specifically, the factory notifies the vendor via the Internet 805 of status information (e.g., the symptom of a manufacturing apparatus in trouble) representing the operation status of each manufacturing apparatus 806, and receives response information (e.g., information designating a remedy against the trouble, or remedy software or data) corresponding to the notification, or maintenance information such as the latest software or help information. Data communication between the factories 802 to 804 and the vendor 801 and data communication via the LAN 811 in each factory adopt a communication protocol (TCP/IP) generally used in the Internet. Instead of using the Internet as an external network of the factory, a dedicated network (e.g., an ISDN) having high security which inhibits access of a third party can be adopted. Also, the user may construct a database in addition to the one provided by the vendor and set the database on an external network, and the host management system may authorize access to the database from a plurality of user factories.

Figure 9:
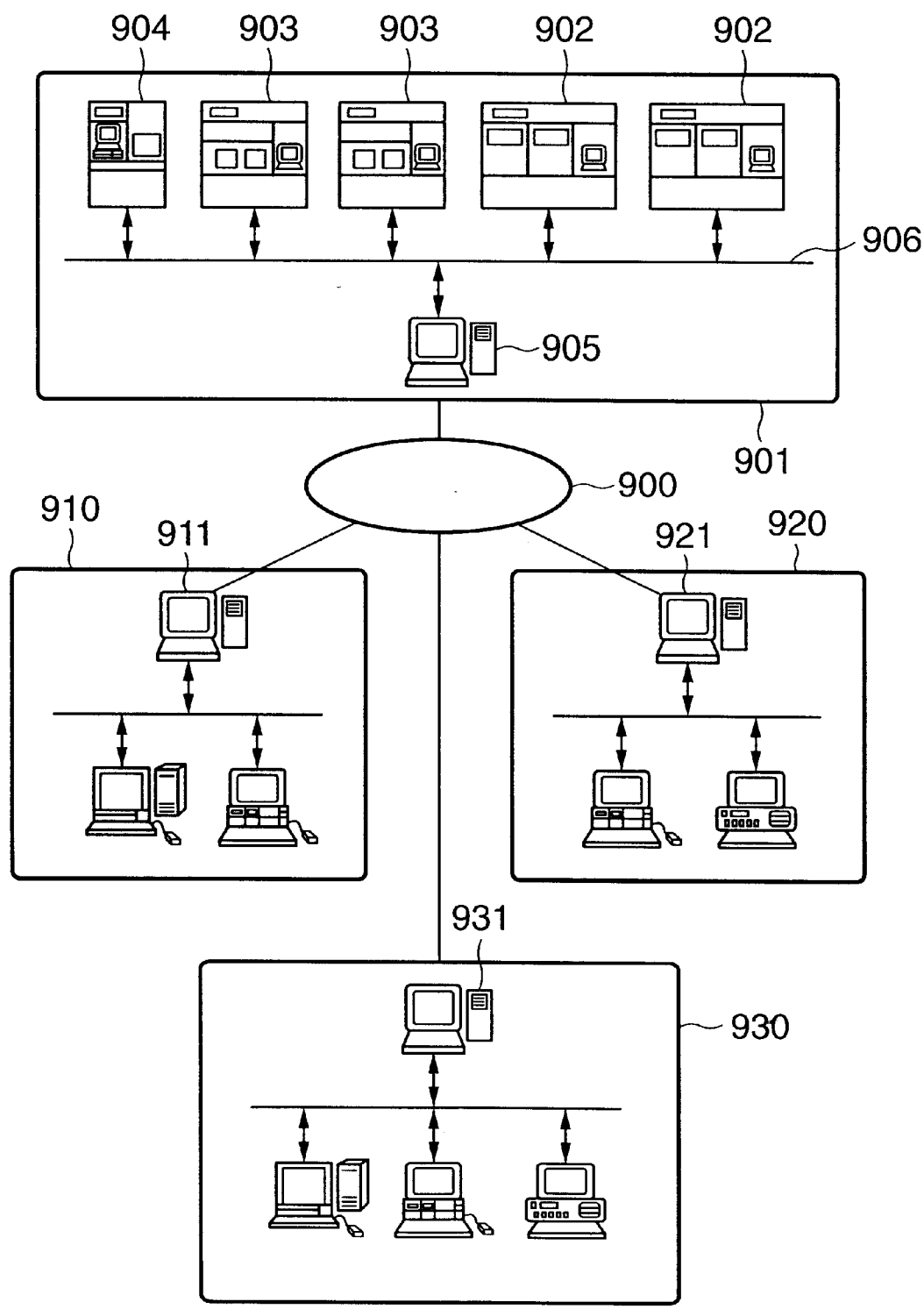
FIG. 9 is a view showing the concept of the semiconductor device production system including the exposure apparatus according to the embodiment of the present invention when viewed from another given angle.

FIG. 9 is a view showing the concept of the overall system of this embodiment that is cut out at a different angle from FIG. 8. In the above example, a plurality of user factories having manufacturing apparatus and the management system of the manufacturing apparatus vendor are connected via an external network, and production management of each factor or information of at least one manufacturing apparatus is communicated via the external network. In the example of FIG. 9, a factory having manufacturing apparatuses of a plurality of vendors and the management systems of the vendors for these manufacturing apparatuses are connected via the external network of the factory, and maintenance information of each manufacturing apparatus is communicated. In FIG. 9, reference numeral 901 denotes a manufacturing factory of a manufacturing apparatus user (e.g., a semiconductor device manufacturer) where manufacturing apparatuses for performing various processes, e.g., an exposure apparatus 902, a resist processing apparatus 903, and a film formation apparatus 904 are installed in the manufacturing line of the factory. FIG. 9 shows only one manufacturing factory 901, but a plurality of factories are networked in practice. The respective apparatuses in the factory are connected to a LAN 960 to build an intranet, and a host management system 905 manages the operation of the manufacturing line. The business offices of vendors (apparatus supply manufacturers) such as an exposure apparatus 910, a resist processing apparatus manufacturer 902, and a film formation apparatus manufacturer 930 comprise host management systems 911, 921, and 931 for executing remote maintenance for the supplied apparatuses. Each host management system has a maintenance database and a gateway for an external network, as described above. The host management system 904 for managing the apparatuses in the manufacturing factory of the user, and the management systems 911, 921, and 931 of the vendors for the respective apparatuses are connected via the Internet or dedicated network serving as an external network 900. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 900. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 10 on the display. While referring to this window, the operator who manages manufacturing apparatuses in each factory inputs, in input items on the windows, pieces of information such as the type of manufacturing apparatus 1001, serial number 1002, subject of trouble 1003, occurrence date 1004, degree of urgency 1005, symptom 1006, remedy 1007, and progress 1008. The pieces of input information are transmitted to the maintenance database via the Internet, and appropriate maintenance information is sent back from the maintenance database and displayed on the display. The user interface provided by the web browser realizes hyperlink functions 1010, 1011, and 1012, as shown in FIG. 10. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention.

Figure 11:
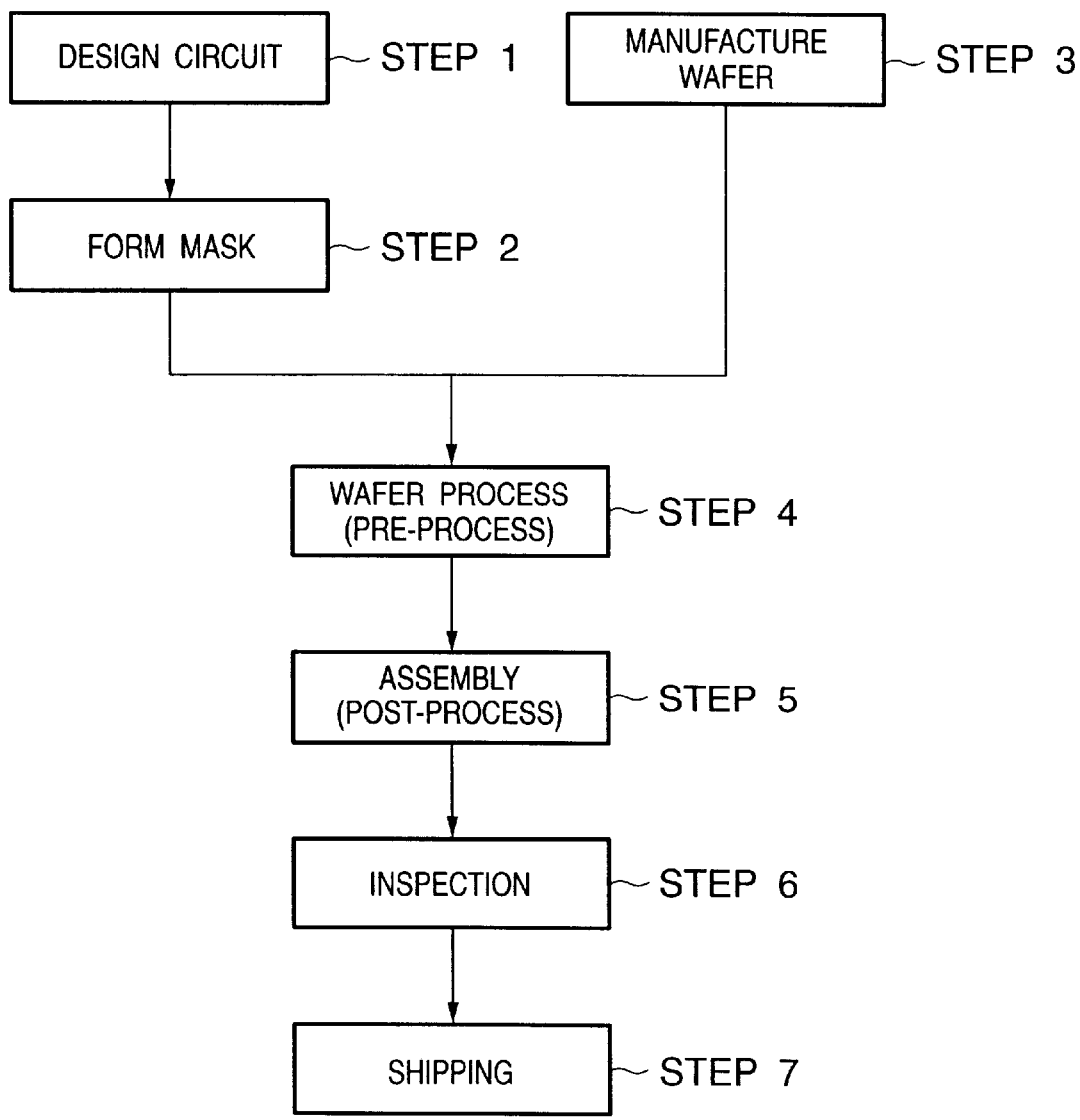
FIG. 11 is a flow chart for explaining the flow of a device manufacturing process by the exposure apparatus according to the embodiment of the present invention.

A semiconductor device manufacturing process using the above-described production system will be explained. FIG. 11 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are formed in separate dedicated factories, and maintenance is done for each of the factories by the above-described remote maintenance system. Information for production management and apparatus maintenance is communicated between the pre-process factory and the post-process factory via the Internet or a dedicated network.

Figure 12:
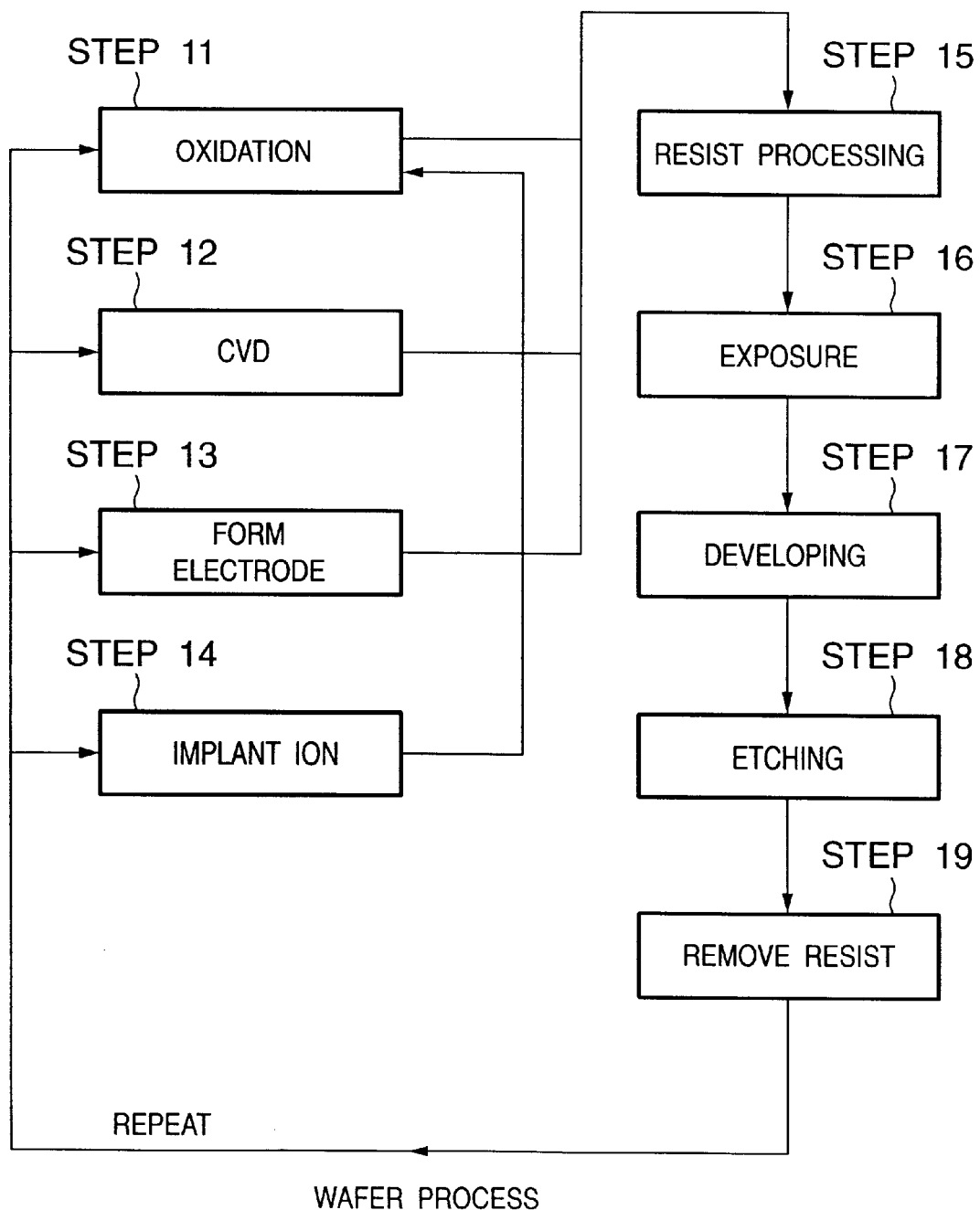
FIG. 12 is a flow chart for explaining a wafer process by the exposure apparatus according to the embodiment of the present invention.

FIG. 12 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The above-described embodiment enables forced exposure when a wafer flatness defect is generated by the process. The influence on peripheral shots exposed normally in etching can be minimized to increase the wafer yield.

The above-described embodiment comprises a function of storing the generation position of a focus control error between the wafers when a wafer flatness defect is generated by the chuck. In addition to the above effects, contamination of the wafer chuck can quickly be found.

The above-described embodiment comprises a function of stopping exposure if scan exposure does not start and retrying exposure when a focus control error is generated under the influence of a disturbance from a floor. The ratio of erroneous exposure shots can be reduced to increase yield.

Moreover, the above-described embodiment comprises a function of automatically determining retry or forced exposure. The stop time of the apparatus due to a wait for an operator determination can be minimized to increase the apparatus availability.

The present invention is not limited to the above embodiments and various changes and modifications can be made within the spirit and scope of the present invention. Therefore, to apprise the public of the scope of the present invention, the following claims are made.

What is claimed is:

1. An exposure apparatus which has a stage for aligning a substrate surface to an imaging plane on the basis of a detection signal from a focus sensor, moves the substrate by the stage, transfers a projection pattern, and exposes the substrate, said apparatus comprising:
   a controller for, when an exposure shot region on the substrate cannot converge to a predetermined precision, determining the exposure shot as an error, and controlling the stage so as to move the substrate to a predetermined position upon determination of the error; and
   an exposure unit for forcibly transferring the projection pattern onto the substrate at the predetermined position in the exposure shot and exposing the substrate.

2. The apparatus according to claim 1, wherein the predetermined position includes at least one of a focus position and tilt position.

3. The apparatus according to claim 1, wherein when an exposure method of said exposure unit is a still method, said controller determines an error on the basis of calculation results of measurement values at a plurality of focus measurement points obtained by measuring focus in the exposure shot region with respect to the imaging plane.

4. The apparatus according to claim 1, wherein when an exposure method of said exposure unit is a scan method, said controller determines an error on the basis of calculation results of measurement values obtained by measuring a focus or tilt for an exposure shot in a region immediately before exposure.

5. The apparatus according to claim 1, wherein when said exposure unit performs forced exposure, the predetermined position includes focus and tilt target values of the stage derived from measurement results of global focus measurement and global tilt measurement that are executed for the substrate in advance.

6. The apparatus according to claim 1, wherein when said exposure unit performs forced exposure, the predetermined position includes focus and tilt target values concerning an exposure shot exposed normally immediately before the forced exposure.

7. The apparatus according to claim 1, wherein when said exposure unit performs forced exposure, said controller causes said exposure unit to continue an exposure sequence.

8. An exposure apparatus for transferring a projection pattern onto a substrate and exposing the substrate while scanning the substrate by a stage, said apparatus comprising:
   a controller for, when an exposure shot region on the substrate cannot converge during scan to a predetermined focus precision or leveling precision, a predetermined two-dimensional sync control precision, or a predetermined exposure amount control precision, determining the exposure shot as an error, and controlling the stage so as to move the substrate to a predetermined position upon determination of the error; and
   an exposure unit for forcibly transferring the projection pattern onto the substrate at the predetermined position in the exposure shot and exposing the substrate.

9. The apparatus according to claim 8, wherein the predetermined position includes at least one of a focus position and a leveling position.

10. The apparatus according to claim 8, wherein when said exposure unit performs forced exposure, the predetermined position includes focus and tilt target values derived from measurement results of global focus measurement and global tilt measurement that are executed for the substrate in advance.

11. The apparatus according to claim 8, wherein when said exposure unit performs forced exposure, the predetermined position includes focus and tilt target values concerning an exposure shot exposed normally immediately before the forced exposure.

12. The apparatus according to claim 8, wherein when said exposure unit performs forced exposure, said controller causes said exposure unit to continue an exposure sequence.

13. An exposure apparatus for transferring a projection pattern onto a substrate and exposing the substrate while scanning the substrate, said apparatus comprising:
   a controller for, when an exposure shot region cannot converge to a predetermined focus precision during scan, determining the exposure shot as an error, and controlling a shot beam from an exposure light source upon determination of the error, wherein said controller shields the shot beam from the exposure light source or stops an emission command upon determination of the error, and said controller retries exposure under the same condition when the shot beam is shielded or the emission command is stopped;
   a stage for moving the substrate to a predetermined position upon determination of the error; and
   an exposure unit for forcibly transferring the projection pattern onto the substrate and exposing the substrate at the predetermined position in the exposure shot,
   wherein said exposure unit executes forced exposure when a focusing error of the exposure light source is determined.

14. The apparatus according to claim 13, wherein when an exposure slit of said exposure unit has already entered an exposure area, said controller causes said exposure unit to complete exposure without shielding the shot beam or stopping the emission command even upon determination of the error.

15. The apparatus according to claim 13, wherein said controller automatically selects, upon determination of the error, whether said exposure unit retries exposure and/or executes forced exposure, and causes said exposure unit to execute an exposure sequence without pausing and/or suspending the exposure sequence.

16. The apparatus according to claim 13, wherein said controller determines an error when a current focus measurement value in the exposure shot exceeds a focus or tilt amount set as a threshold for error determination based on a previous measurement value.

17. The apparatus according to claim 16, further comprising a memory for storing an exposure shot position upon determination of the error for each substrate.

18. The apparatus according to claim 17, wherein said controller identifies generation of contamination of a wafer chuck on the basis of positional information of the exposure shot stored for each substrate.

19. The apparatus according to claim 18, wherein said controller performs at least one of pausing and suspending an exposure sequence by an exposure unit when contamination of the wafer chuck is identified.

20. The apparatus according to claim 19, wherein said controller has an interface for issuing a warning to an operator when contamination of the wafer chuck is identified.

21. A semiconductor device manufacturing method comprising the steps of:
installing, in a semiconductor manufacturing factory, manufacturing apparatuses for performing various processes, including an exposure apparatus which has a stage for aligning a substrate surface to an imaging plane on the basis of a detection signal from a focus sensor, moves the substrate by the stage, transfers a projection pattern, and exposes the substrate, a controller for, when an exposure shot region on the substrate cannot converge to a predetermined precision, determining the exposure shot as an error, and controlling the stage so as to move the substrate to a predetermined position upon determination of the error and an exposure unit for forcibly transferring the projection pattern onto the substrate at the predetermined position in the exposure shot and exposing the substrate; and
manufacturing a semiconductor device by using the manufacturing apparatuses in a plurality of processes.

22. The method according to claim 21, further comprising the steps of:
connecting the manufacturing apparatuses by a local area network; and
communicating information about at least one of the manufacturing apparatuses between the local area network and an external network outside the semiconductor manufacturing factory.

23. The method according to claim 22, further comprising performing one of accessing a database provided by a vendor or user of the exposure apparatus via the external network to obtain maintenance information of the manufacturing apparatus by data communication, and performing production management by data communication between the semiconductor manufacturing factory and another semiconductor manufacturing factory via the external network.

24. A semiconductor manufacturing factory comprising:
manufacturing apparatuses for performing various processes including an exposure apparatus which has a stage for aligning a substrate surface to an imaging plane on the basis of a detection signal from a focus sensor, moves the substrate by the stage, transfers a projection pattern, and exposes the substrate, a controller for, when an exposure shot region on the substrate cannot converge to a predetermined precision, determining the exposure shot as an error, and controlling the stage so as to move the substrate to a predetermined position upon determination of the error and an exposure unit for forcibly transferring the projection pattern onto the substrate at the predetermined position in the exposure shot and exposing the substrate;
a local area network for connecting said manufacturing apparatuses; and
a gateway which allows the local area network to access an external network outside the factory,
wherein information about at least one of said manufacturing apparatuses can be communicated.

25. A maintenance method for an exposure apparatus which has a stage for aligning a substrate surface to an imaging plane on the basis of a detection signal from a focus sensor, moves the substrate by the stage, transfers a projection pattern, and exposes the substrate, a controller for, when an exposure shot region on the substrate cannot convert to a predetermined precision, determining the exposure shot as an error, and controlling the stage so as to move the substrate to a predetermined position upon determination of the error and an exposure unit for forcibly transferring the projection pattern onto the substrate at the predetermined position in the exposure shot and exposing the substrate, and is installed in a semiconductor manufacturing factory, said method comprising the steps of:
causing a vendor or user of the exposure apparatus to provide a maintenance database connected to an external network of the semiconductor manufacturing factory;
authorizing access from the semiconductor manufacturing factory to the maintenance database via the external network; and
transmitting maintenance information accumulated in the maintenance database to the semiconductor manufacturing factory via the external network.

26. The apparatus according to claim 1, further comprising a display, a network interface, and a computer for executing network software,
wherein maintenance information of the exposure apparatus can be communicated via a computer network.

27. The apparatus according to claim 26, wherein the network software is connected to an external network of a factory in which the exposure apparatus is installed, provides on said display a user interface for accessing a maintenance database provided by a vendor or user of the exposure apparatus, and enables obtaining information from the database via the external network.

28. An exposure apparatus which executes an exposure sequence for exposing through a projection optical system a transfer pattern formed on a master onto a substrate by forming an exposure shot onto the substrate, said apparatus comprising:
a detecting unit which detects a surface position of the substrate;
a determination unit which determines the exposure shot as an error when a detection result by the detecting unit exceeds a preset allowable value; and
an exposure unit which moves the substrate to a predetermined surface position and executes the exposure sequence when the determination unit determines the exposure shot as an error.

29. The exposure apparatus according to claim 28, wherein the predetermined surface position is determined based on one of a global focus measurement and a global tilting measurement obtained in advance of the exposure sequence.

30. The exposure apparatus according to claim 28, wherein said exposure unit forms a plurality of the exposure shots by repeating the exposure sequence, and the predetermined surface position is determined based on a detection result detected from exposed shots.

31. The exposure apparatus according to claim 28, further comprising means for causing an operator to determine subsequent exposure when a number of exposure shots exposed by said exposure unit exceeds a preset allowable value.

32. The exposure apparatus according to claim 28, further comprising means for causing an operator to determine subsequent exposure when shot times exposed by said exposure unit exceed a preset allowable value.

33. The exposure apparatus according to claim 28, further comprising means for judging a contamination condition of a chuck which holds the substrate, based on position information of the exposure shot exposed by moving the substrate to a predetermined surface position by said exposure unit.

34. An exposure apparatus which executes an exposure sequence for exposing through a projection optical system a transfer pattern formed on a master onto a substrate, said apparatus comprising:
   a detecting unit which detects a surface position of the substrate; and
   an exposure unit which moves the substrate to a predetermined surface position and executes the exposure sequence when a detection result by said detecting unit exceeds a preset allowable value,
   wherein the predetermined surface position is determined based on one of a global focus measurement and a global tilting measurement obtained in advance of the exposure sequence.

35. An exposure apparatus which executes an exposure sequence for repeatedly exposing through a projection optical system a transfer pattern formed on a master onto a substrate by forming a plurality of exposure shots onto the substrate, said apparatus comprising:
   a detecting unit which detects a surface position of the substrate; and
   an exposure unit which moves the substrate to a predetermined surface position and executes the exposure sequence when a detection result by said detecting unit exceeds a preset allowance value,
   wherein the predetermined surface position is determined based on the detection result detected from exposed shots.

36. A scanning type exposure apparatus which executes an exposure sequence for exposing through a projection optical system a transfer pattern formed on a master onto a substrate by relatively scanning the master and the substrate and forming an exposure shot onto the substrate, said apparatus comprising:
   a detecting unit which detects a surface position of the substrate;
   a determination unit which determines the exposure shot as an error when a detection result by said detecting unit exceeds a preset allowable value; and
   an exposure unit which moves the substrate to a predetermined surface position and executes the exposure sequence when the determination unit determines the exposure shot as an error.

37. A scanning type exposure apparatus which executes an exposure sequence for exposing through a projection optical system a transfer pattern formed on a master onto a substrate by relatively scanning the master and the substrate, said apparatus comprising:
   a detecting unit which detects a surface position of the substrate; and
   an exposure unit which moves the substrate to a predetermined surface position and executes the exposure sequence when a detection result by said detecting unit exceeds a preset allowable value,
   wherein the predetermined surface position is determined based on one of a global focus measurement and a global tilting measurement obtained in advance of the exposure sequence.

38. A scanning type exposure apparatus which executes an exposure sequence for exposing through a projection optical system a transfer pattern formed on a master onto a substrate by relatively scanning the master and the substrate and forming a plurality of exposure shots onto the substrate, said apparatus comprising:
   a detecting unit which detects a surface position of the substrate; and
   an exposure unit which moves the substrate to a predetermined surface position and executes the exposure sequence when a detection result by said detecting unit exceeds a preset allowable value,
   wherein the predetermined surface position is determined based on the detection result detected from exposed shots.

39. A semiconductor device manufacturing method comprising the steps of:
   installing, in a semiconductor manufacturing factory, manufacturing apparatuses for performing various processes including an exposure apparatus which executes an exposure sequence for exposing through a projection optical system a transfer pattern formed on a master onto a substrate by forming an exposure shot onto the substrate and comprises (i) a detecting unit which detects a surface position of the substrate, (ii) a determination unit which determines the exposure shot as an error when a detection result by the detecting unit exceeds a preset allowable value, and (iii) an exposure unit which moves the substrate to a predetermined surface position and executes the exposure sequence when the determination unit determines the exposure shot as an error; and
   manufacturing a semiconductor device by using the manufacturing apparatuses in a plurality of processes.

40. The method according to claim 39, further comprising the steps of:
   connecting the manufacturing apparatuses by a local area network; and
   communicating information about at least one of the manufacturing apparatuses between the local area network and an external network outside the semiconductor manufacturing factory.

41. The method according to claim 40, further comprising accessing a database provided by a vendor or user of the exposure apparatus via the external network to obtain maintenance information of the manufacturing apparatus by data communication.

42. The method according to claim 40, further comprising performing production management by performing data communication between the semiconductor manufacturing factory and another semiconductor manufacturing factory via the external network.

43. A semiconductor device manufacturing method comprising the steps of:

installing, in a semiconductor manufacturing factory, manufacturing apparatuses for performing various processes, including an exposure apparatus which executes an exposure sequence for exposing through a projection optical system a transfer pattern formed on a master onto a substrate and comprises (i) a detecting unit which detects a surface position of the substrate and (ii) an exposure unit which moves the substrate to a predetermined surface position and executes the exposure sequence when a detection result by the detecting unit exceeds a preset allowable value, the predetermined surface position being determined based on one of a global focus measurement and a global tilting measurement obtained in advance of the exposure sequence; and manufacturing a semiconductor device by using the manufacturing apparatuses in a plurality of processes.

44. The method according to claim 43, further comprising the steps of:

connecting the manufacturing apparatuses by a local area network; and communicating information about at least one of the manufacturing apparatuses between the local area network and an external network outside the semiconductor manufacturing factory.

45. The method according to claim 44, further comprising accessing a database provided by a vendor or user of the exposure apparatus via the external network to obtain maintenance information of the manufacturing apparatus by data communication.

46. The method according to claim 44, further comprising performing production management by data communication between the semiconductor manufacturing factory and another semiconductor manufacturing factory via the external network.

47. A semiconductor device manufacturing method comprising the steps of:

installing, in a semiconductor manufacturing factory, manufacturing apparatuses for performing various processes, including an exposure apparatus which executes an exposure sequence for repeatedly exposing through a projection optical system a transfer pattern formed on a master onto a substrate by forming a plurality of exposure shots onto the substrate and comprises a detecting unit which detects a surface position of the substrate and an exposure unit which moves the substrate to a predetermined surface position and executes the exposure sequence when a detection result by the detecting unit exceeds a preset allowance value, the predetermined surface position being determined based on the detection result detected from exposed shots; and manufacturing a semiconductor device by using the manufacturing apparatuses in a plurality of processes.

48. The method according to claim 47, further comprising the steps of:

connecting the manufacturing apparatuses by a local area network; and communicating information about at least one of the manufacturing apparatuses between the local area network and an external network outside the semiconductor manufacturing factory.

49. The method according to claim 48, further comprising accessing a database provided by a vendor or user of the exposure apparatus via the external network to obtain maintenance information of the manufacturing apparatus by data communication.

50. The method according to claim 48, further comprising performing production management by data communication between the semiconductor manufacturing factory and another semiconductor manufacturing factory via the external network.

51. An apparatus for exposing each of a plurality of regions of a substrate to a pattern, said apparatus comprising:

a detection unit which detects a position of the substrate;

a determination unit which determines whether a position detected by said detection unit is allowable, for each of the plurality of regions; and an exposure unit which positions the substrate at a predetermined position and exposes the substrate to the pattern for each of the plurality of regions for which said determination unit makes a negative determination.

52. The apparatus according to claim 51, wherein said apparatus exposes the substrate to the pattern by scanning radiant energy.

53. The apparatus according to claim 52, wherein said exposure unit positions the substrate at the predetermined position and exposes the substrate to the pattern, after the determination unit makes a negative determination, for one of the plurality of regions for which said determination unit makes the negative determination.

54. A device manufacturing method comprising the steps of:

installing, in a device manufacturing factory, an apparatus for exposing each of a plurality of regions of a substrate to a pattern, the apparatus comprising:
(i) a detection unit which detects a position of the substrate;
(ii) a determination unit which determines whether a position detected by said detection unit is allowable, for each of the plurality of regions; and
(iii) an exposure unit which positions the substrate at a predetermined position and exposes the substrate to the pattern for each of the plurality of regions for which the determination unit makes a negative determination; and manufacturing a device by using the apparatus.

* * * * *

UNITED STATES PATENT AND TRADEMARK OFFICE
CERTIFICATE OF CORRECTION

PATENT NO. : 6,657,703 B2
DATED : December 2, 2003
INVENTOR(S) : Hiroshi Kurosawa It is certified that error appears in the above-identified patent and that said Letters Patent is hereby corrected as shown below:

<u>Title page,</u>
Item [56], References Cited, U.S. PATENT DOCUMENTS, the second-listed patent document "4,996,640 A 2/1991 Yamada et al." should be deleted; the fourth-listed patent document "5,113,229 A 5/1992 Higashio et al." should be deleted; the fifth-listed patent document "5,115,320 A 5/1992 Ebihara et al." should be deleted; and the eighth-listed patent document "5,999,707 A 12/1999 Taniguchi et al." should be deleted.

<u>DRAWINGS,</u>
Sheet 4, FIG. 4, step "417," "EXCUTE" should read -- EXECUTE --.
Sheet 7, FIG. 7, in the second legend box at the top of the figure entitled "Status:," "Force Exposured" should read -- Forced Exposure --.

<u>Column 2,</u>
Line 11, "N" should read -- No --.

<u>Column 6,</u>
Line 18, "even" should read -- events --.

<u>Column 7,</u>
Line 26, "processing" should read -- a process --.

<u>Column 8,</u>
Line 2, "Value" should read -- value --.
Line 38, "Y" should read -- Yes --.
Line 40, "N," should read -- No, --.

UNITED STATES PATENT AND TRADEMARK OFFICE
CERTIFICATE OF CORRECTION

PATENT NO.    : 6,657,703 B2
DATED         : December 2, 2003
INVENTOR(S)   : Hiroshi Kurosawa It is certified that error appears in the above-identified patent and that said Letters Patent is hereby corrected as shown below:

<u>Column 11,</u>
Line 58, "a" should be deleted.

Signed and Sealed this

Fifteenth Day of June, 2004

JON W. DUDAS
*Acting Director of the United States Patent and Trademark Office*